United States Patent
Liu et al.

(10) Patent No.: US 7,006,358 B2
(45) Date of Patent: Feb. 28, 2006

(54) SUBRACK FOR PLUG-IN UNITS

(75) Inventors: Will Liu, Shenzhen (CN); Shoulun Wang, Shenzhen (CN); Patrick Bai, Shenzhen (CN); Chuancheng Hou, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 25 days.

(21) Appl. No.: 10/873,577

(22) Filed: Jun. 21, 2004

(65) Prior Publication Data

US 2004/0257776 A1    Dec. 23, 2004

(30) Foreign Application Priority Data

Jun. 21, 2003   (CN)   ............... 03 2 47668 U

(51) Int. Cl.
| | | |
|---|---|---|
| H05K 5/00 | (2006.01) | |
| H05K 5/04 | (2006.01) | |
| H05K 5/06 | (2006.01) | |

(52) U.S. Cl. .................. 361/752; 174/35 GC; 361/753
(58) Field of Classification Search ................ 361/752, 361/753, 759, 761, 801, 802, 796, 797–799, 361/763, 727, 725, 686, 751, 756; 174/35 GC
See application file for complete search history.

(56) References Cited

U.S. PATENT DOCUMENTS

| | | | | |
|---|---|---|---|---|
| 3,231,785 | A | * | 1/1966 | Calabro ....................... 361/689 |
| 3,699,393 | A | * | 10/1972 | Reimer ........................ 361/797 |
| 3,723,823 | A | * | 3/1973 | Lit et al. ..................... 361/802 |
| 3,731,157 | A | * | 5/1973 | Reimer ........................ 361/802 |
| 4,019,099 | A | * | 4/1977 | Calabro ....................... 361/756 |
| 4,034,871 | A | * | 7/1977 | Jorgensen ................ 211/41.17 |
| 5,559,676 | A | * | 9/1996 | Gessaman ................... 361/752 |
| 5,735,411 | A | * | 4/1998 | Flamme et al. ............... 211/26 |
| 5,917,147 | A | * | 6/1999 | Lewis .................... 174/35 GC |
| 6,005,186 | A | * | 12/1999 | Bachman .................. 174/35 R |
| 6,134,119 | A | | 10/2000 | Gunther et al. |
| 6,474,479 | B1 | | 11/2002 | Kurrer et al. |
| 6,483,023 | B1 | * | 11/2002 | Jacques .................. 174/35 GC |
| 2003/0214798 | A1 | * | 11/2003 | Shirakami et al. .......... 361/796 |
| 2005/0122701 | A1 | * | 6/2005 | Coffey ........................ 361/796 |

FOREIGN PATENT DOCUMENTS

CN    ZL99201828    2/2000

* cited by examiner

*Primary Examiner*—Kamand Cuneo
*Assistant Examiner*—Hung Nguyen
(74) *Attorney, Agent, or Firm*—Wei Te Chung

(57) ABSTRACT

A subrack (1) for use in industrial electronics includes two parallel sidewalls 10, bottom and top walls (40, 30) cooperatively defining a space therebetween for receiving plug-in units (50) therein. Each of the bottom and top walls includes a first plate (35) defining a number of spaced slide channels, and a second plate (31) fixed to the first plate. After the plug-in units slide into the subrack along the slide channels, mounting panels (52) of the plug-in units engage with fronts of the bottom and top walls thereby securing the plug-in units in the subrack. The first and second plates can be produced from sheet steel having a same thickness, which significantly reduces the manufacturing costs.

20 Claims, 5 Drawing Sheets

SUBRACK FOR PLUG-IN UNITS

BACKGROUND OF THE INVENTION

1. Field of the Invention

The present invention relates to component mounting apparatuses, and particularly to a subrack having plate members for mounting plug-in units therein.

2. Related Art

Subracks for receiving plug-in units therein have been known in the electronics industry for a long time. A typical subrack comprises two sidewalls each having four corners, and four module rails fixed between the sidewalls, the module rails conventionally being screwed to the corresponding corners of the sidewalls. Bottom, top and back walls are attached to the subrack, and cooperate with the sidewalls to define a receiving space therebetween and an open side. The plug-in units can be inserted into and removed from the receiving space via the open side. The plug-in units typically comprise mounting panels engaging with two front module rails to thereby hold the plug-in units in place. For a thorough understanding of this kind of subrack, refer to the IEEE (International Electrical and Electronics Engineers) Standard 1101.10 established in 1996.

To enable fastening of the mounting panels, the module rails are required to have rather elaborate structures. Typically, the module rails consist of extruded aluminum. P.R. China Pat. No. 99201828.5, U.S. Pat. No. 6,134,119 and U.S. Pat. No. 6,474,479 disclose a variety of such extruded aluminum module rails. The extruded aluminum module rails generally each comprise a transverse rail defining a plurality of longitudinal grooves therein, and a centering strip and a threaded strip received in respective of the grooves. A row of equidistant centering holes is defined longitudinally in the centering strip, and a row of equidistant threaded holes is defined longitudinally in the threaded strip corresponding to the centering holes. For production of these rather elaborate components, complicated tools are required. Manufacturing of the module rails is quite expensive. In addition, assembling the discrete components (i.e., the sidewalls, and the bottom, top and back walls) and the module rails to complete a subrack is unduly laborious.

Thus, a new subrack for plug-in units which overcomes the above-mentioned problems is desired.

SUMMARY OF THE INVENTION

Accordingly, an object of the present invention is to provide a subrack for a plurality of plug-in units, the subrack having low manufacturing costs.

Another object of the present invention is to provide a subrack which has a simple structure and can be easily assembled.

To achieve the above-mentioned objects, a subrack in accordance with a preferred embodiment of the present invention comprises a pair of parallel sidewalls, identical bottom and top walls fixed between the sidewalls to cooperatively define a receiving space therebetween adapted to accommodate the plug-in units therein. Each of the bottom and top walls comprises first and second plates. The first plate comprises a main portion and a recessed edge portion. The main portion defines a plurality of spaced slide channels, and a plurality of alignment grooves adjacent the slide channels. The recessed edge portion defines a plurality of through apertures therein. The second plate comprises a vertical portion defining a plurality of threaded apertures corresponding to the through apertures of the recessed edge portion, first and second horizontal portions extending from bottom and top sides of the vertical portion in respective opposite directions. At least one of the first and second horizontal portions is attached to the recessed edge portion thereby fixing the first and second plates together.

Other objects, advantages and novel features of the present invention will be drawn from the following detailed description of the preferred embodiment of the present invention with the attached drawings, in which:

DESCRIPTION OF THE PREFERRED EMBODIMENTS

Figure 1:
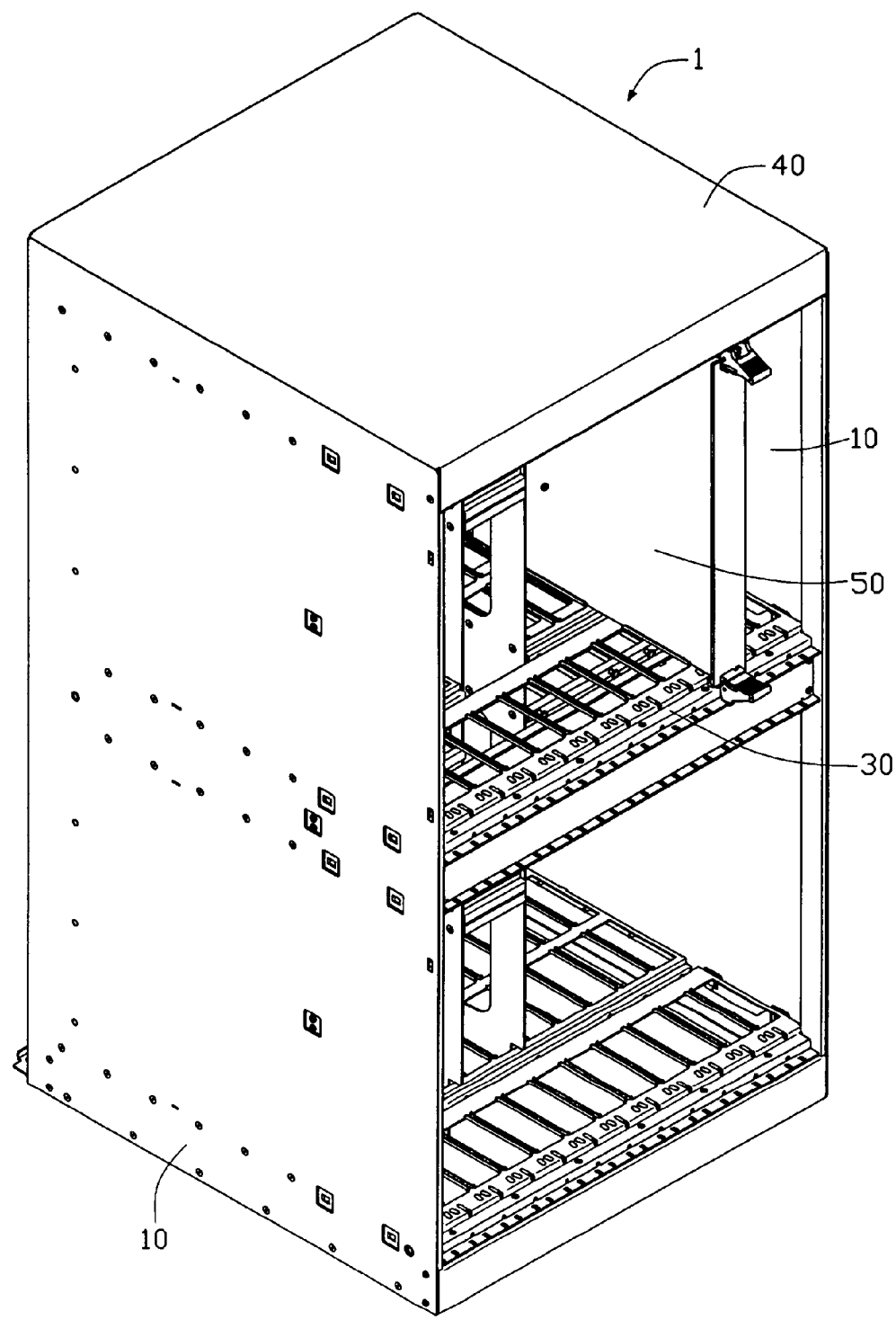
FIG. 1 is an isometric view of a subrack in accordance with the preferred embodiment of the present invention, together with a plug-in unit received therein.

Referring to FIG. 1, a subrack 1 of the present invention is for receiving a plurality of spaced plug-in units 50 therein. For the sake of simplicity, only one plug-in unit 50 is shown and described hereafter. The subrack 1 of the preferred embodiment has two levels for plug-in units 50. It should be appreciated that the subrack 1 may alternatively be configured to have only one level, or three or more levels. For the sake of describing the preferred embodiment simply, only the upper of the two levels is described hereafter. The subrack 1 comprises two parallel sidewalls 10, and opposite top and bottom walls 40, 30 fixed between the sidewalls 10. The sidewalls 10 and top and bottom walls 40, 30 cooperatively define a space therebetween for receiving the plug-in units 50.

Figure 5:
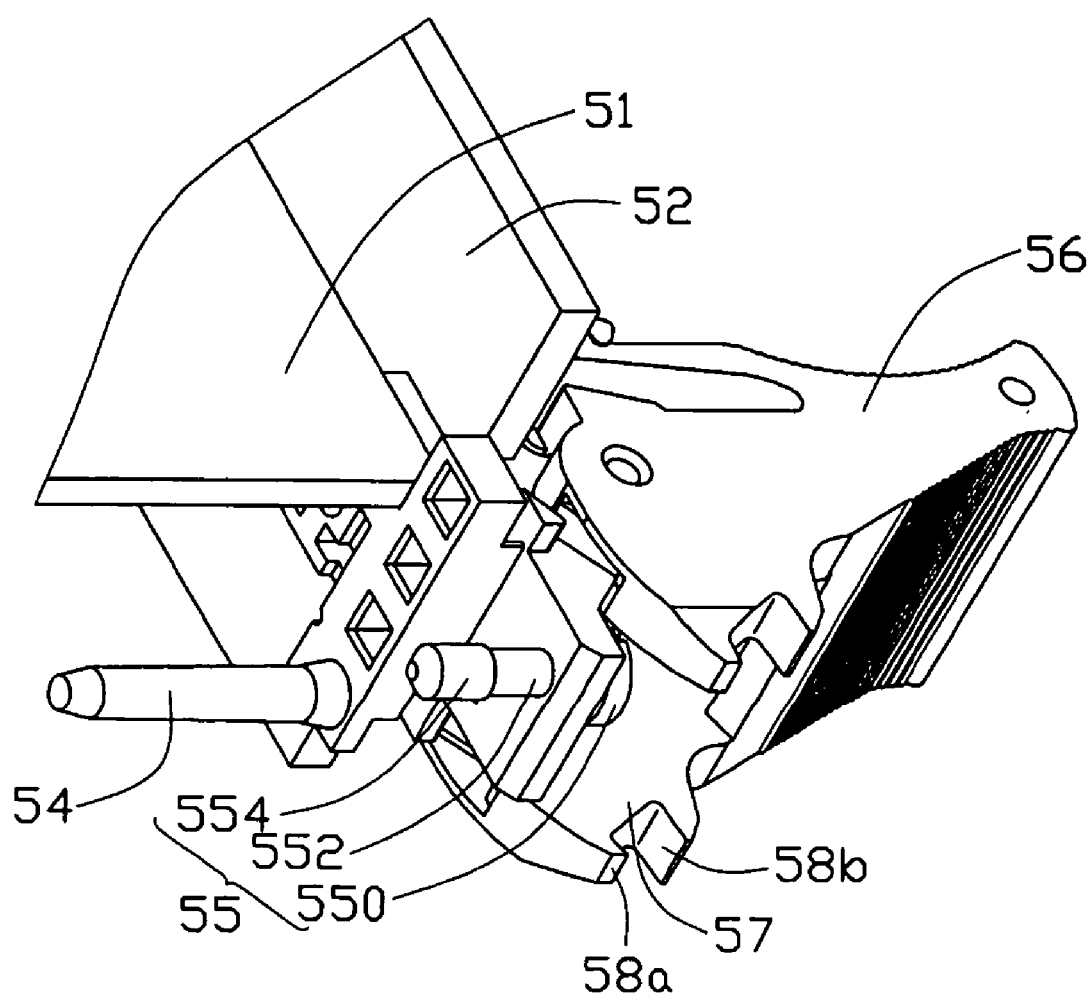
FIG. 5 is an enlarged view of a part of the plug-in unit of FIG. 1, but viewed from another aspect.

Referring also to FIG. 5, the plug-in unit 50 comprises a printed circuit board (PCB) 51, and a mounting panel 52 attached to a front end of the PCB 51. A pair of handles 56 is attached to top and bottom ends of the mounting panel 52 respectively. Each handle 56 is known in the art as an "injector/extractor handle," and is used for inserting or extracting the plug-in unit 50 into or from the subrack 1. The handle 56 at a top end of the mounting panel 52 comprises a pair of upwardly-facing claws 57 at top side thereof. The handle 56 at a bottom end of the mounting panel 52 comprises a pair of downwardly-facing claws 57 at a bottom side thereof. For the sake of simplicity, only the latter of the handles 56 is described hereafter. Each claw 57 comprises a front nail 58a and a rear nail 58b. An alignment pin 54 extends inwardly from an inside of each end of the mounting panel 52. A screw 55 is movably retained in the mounting panel 52 adjacent each alignment pin 54. Each screw 55 comprises a threaded shank portion 554 located at an inside of the mounting panel 52, a smooth shank portion 552 coaxially extending from the threaded shank portion 554 and extending through a corresponding hole (not labeled) of the mounting panel 52, and a screw head 550 located at an outside of the mounting panel 52. Prior to attachment of the plug-in unit 50 in the subrack 1, the screw 55 can be freely moved forward and rearward in the hole. A maximum travel of the screw 55 is defined by a length of the smooth shank portion 552 of the screw 55.

Figure 2:
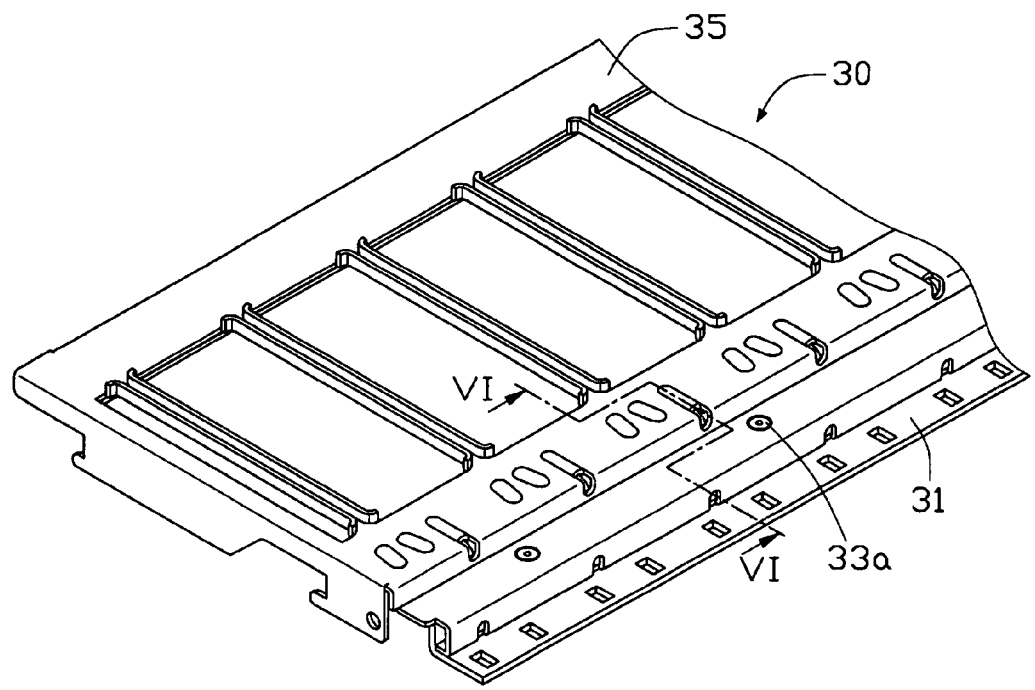
FIG. 2 is an enlarged, isometric view of a part of a bottom wall of the subrack of FIG. 1.
Figure 3:
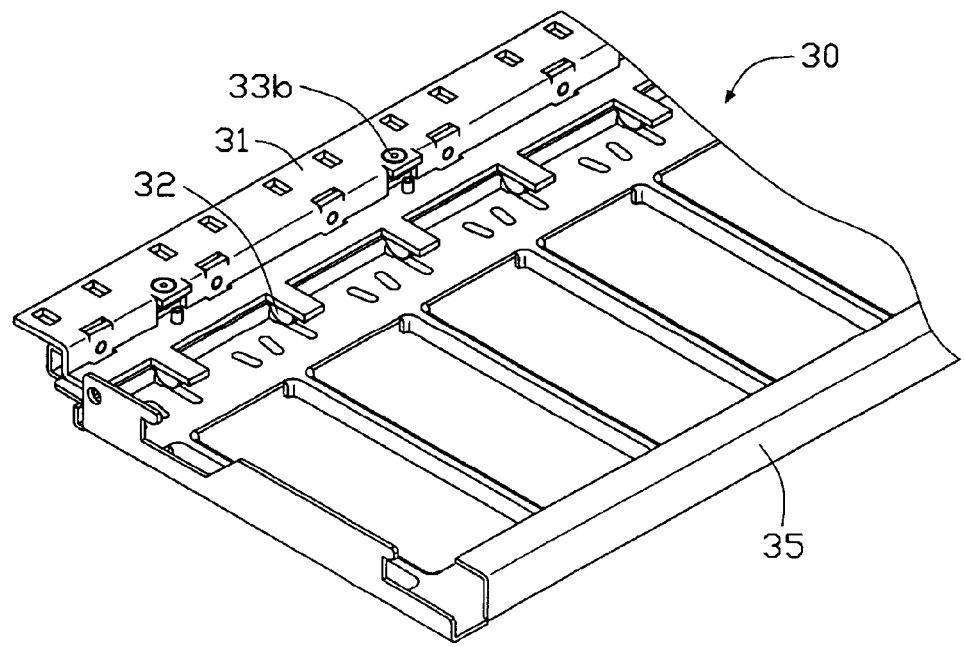
FIG. 3 is similar to FIG. 2, but showing the bottom wall inverted.
Figure 4:
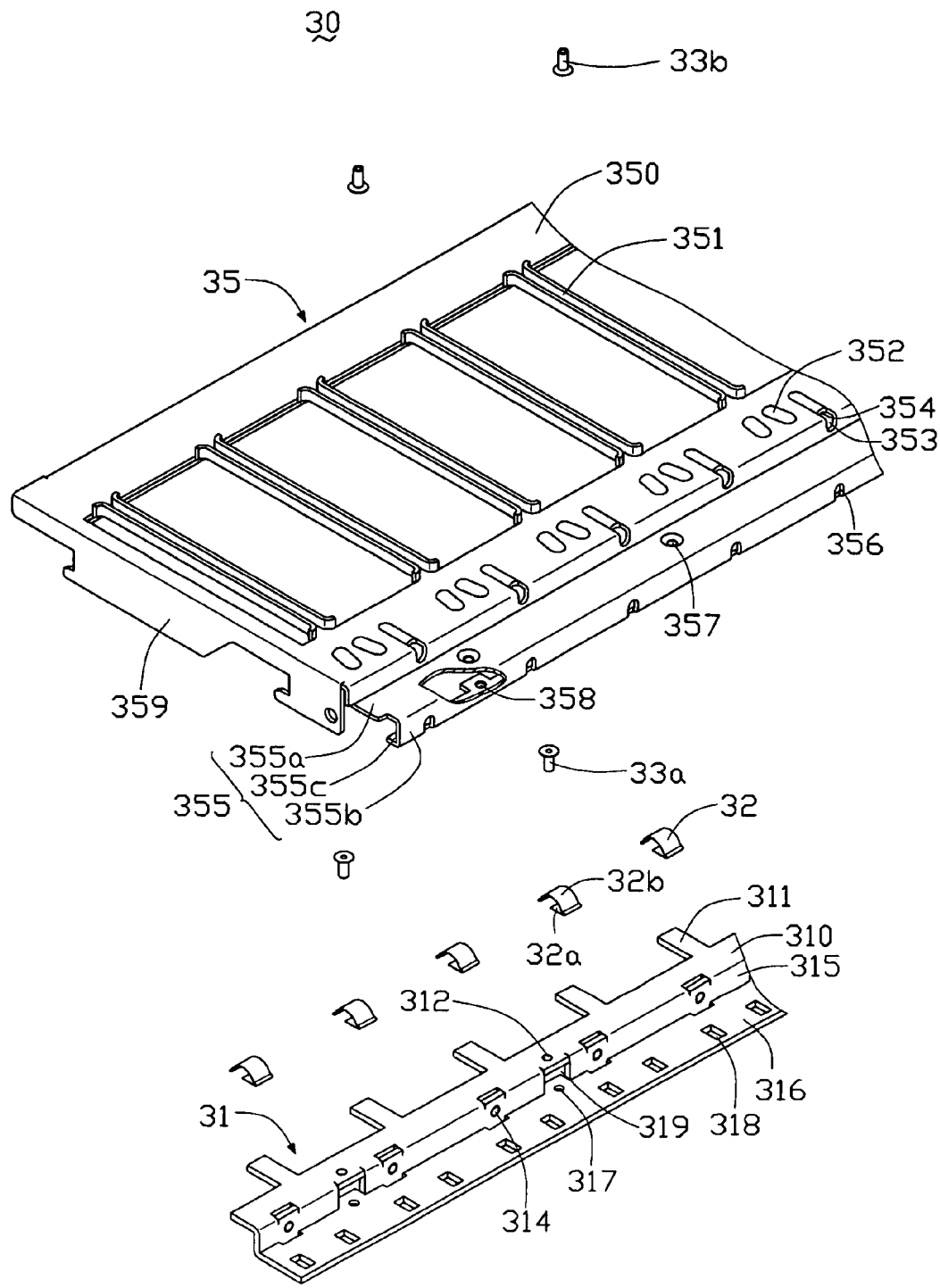
FIG. 4 is an exploded view of the bottom wall of FIG. 2.

The top and bottom walls 40, 30 are made from corrosion-protected sheet steel, and are identical in the preferred embodiment. For the sake of simplicity, FIGS. 2 through 4 illustrate only the bottom wall 30. The bottom wall 30 comprises first and second plates 35, 31, which have a same thickness and are attached together by fastening devices such as rivets 33a, 33b. Alternatively, other fastening means such as soldering can be used for connecting the first and second plates 35, 31 together. To prevent accumulation of static electricity, a plurality of conductive gaskets 32 is attached between the first and second plates 35,31.

The first plate 35 comprises a main portion 350, and a recessed edge portion 355. A plurality of parallel, evenly spaced slide channels 351 is defined in the main portion 350, for slidingly receiving respective PCBs 51 therein. Preferably, the slide channels 351 are formed by a stamping process. That is, parts of the main portion 350 are stamped upwardly to form a plurality of pairs of vertical tabs 351a, 351b. Each pair of vertical tabs 351a, 351b cooperatively defines one slide channel 351 therebetween. Rear and front ends of each pair of vertical tabs 351a, 351b are flared. A pair of spaced, divergent protrusions 352 is formed on the main portion 350 in front of each slide channel 351. The protrusions 352 cooperatively form a V-shaped entrance for guiding a corresponding PCB 51 into the slide channel 351. An alignment hole 353 is defined in the main portion 350 adjacent each pair of protrusions 352, corresponding to the alignment pin 54 of a respective plug-in unit 50. A part of the main portion 350 adjacent each alignment hole 353 is stamped upwardly to define an underside alignment groove 354, the alignment groove 354 being in communication with the alignment hole 353. A pair of side flanges 359 depends from opposite ends of the main portion 350 respectively. The side flanges 359 each define a screw hole (not labeled) and a hooking structure (not labeled), for connection of the first plate 35 to the sidewalls 10. Alternatively, other suitable joining means may instead be provided on the side flanges 359 for connection of the first plate 35 to the sidewalls 10.

The recessed edge portion 355 sequentially comprises first, second and third bent plates 355a, 355b, 355c integrally joined together at respective perpendicularly bent junctions therebetween. The first and third bent plates 355a, 355c define a row of spaced rivet holes 357, 358 respectively. A row of spaced through apertures 356 is defined in the second bent plate 355b.

The second plate 31 comprises a vertical portion 315, and first and second horizontal portions 316, 310 extending from bottom and top sides of the vertical portion 315 in respective opposite directions. A row of screw apertures 314 is defined in the vertical portion 315, corresponding to the row of through apertures 356 of the first plate 35. A plurality of pairs of rectangular openings 318 is defined in a front part of the first horizontal portion 316. Each pair of rectangular openings 318 can engagingly receive the rear nails 58a of the claw 57 of the handle 56 respectively. A plurality of rivet holes 317 is defined in a rear part of the first horizontal portion 316, corresponding to the rivet holes 358 of the third bent plate 355c. A plurality of extensions 311 is formed at a rear side of the second horizontal portion 310, for aligning with the alignment holes 353 and creating corresponding spaces for receiving the gaskets 32. A plurality of rivet holes 312 is defined in a front part of the second horizontal portion 310, corresponding to the rivet holes 357 of the first bent plate 355a. A plurality of through openings 319 is defined in the vertical portion 315, for providing spaces for insertion of protrusions of the third bent plate 355c that correspond to the rivet holes 358. Rivets 33a, 33b are extended through the rivet holes 357, 312 and through the rivet holes 358, 317, thereby securely joining the first and second plates 35, 31 together.

Each gasket 32 comprises a flat mounting portion 32a attached to a corresponding extension 311 of the second plate 31, and an arcuate contact portion 32b extending obliquely from a side of the mounting portion 32a. The contact portion 32b is for resiliently abutting the alignment pin 55 of the handle 56 of the plug-in unit 50. In the preferred embodiment, the mounting portion 32a of the gasket 32 is adhered to the extension 311. Other suitable attachment means such as screw jointing can alternatively be adopted.

Figure 6:
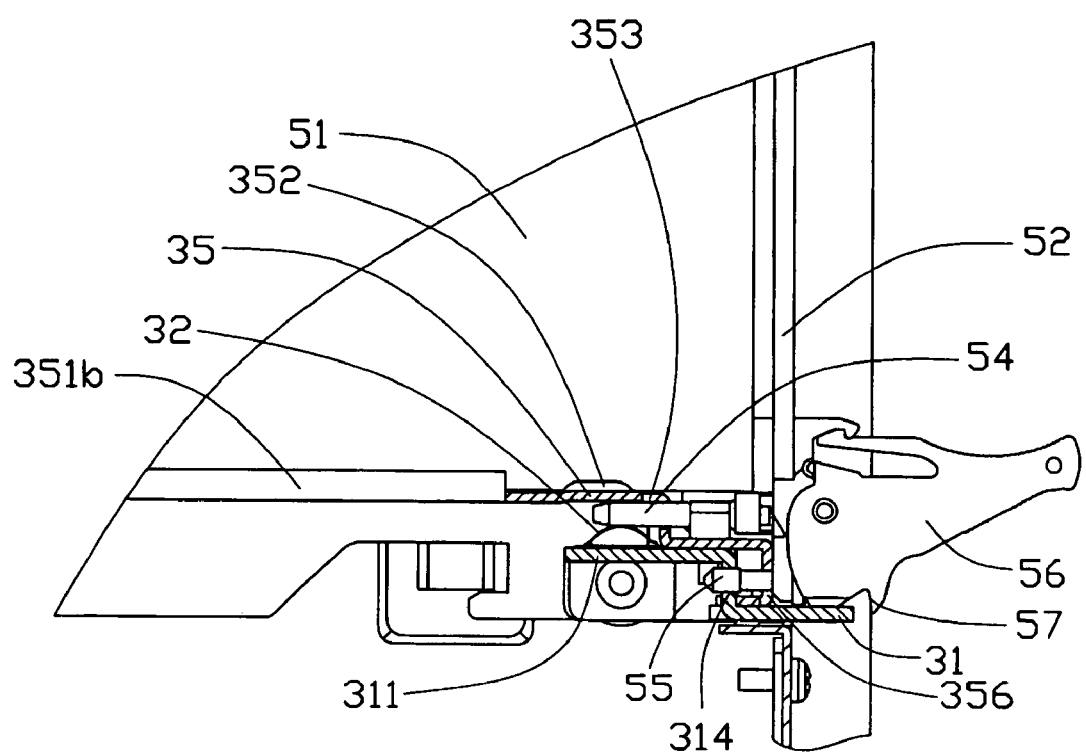
FIG. 6 is a schematic cross-sectional view of the bottom wall of FIG. 2, corresponding to line VI—VI thereof, and showing the plug-in unit engaged therewith.

FIG. 6 shows assembly of the plug-in unit 50 into the subrack 1. For the sake of simplicity, only the bottom wall 30 and the corresponding handle 56 of the plug-in unit 50 are shown and described hereafter. The plug-in unit 50 is positioned adjacent a corresponding pair of protrusions 352. The plug-in unit 50 is pushed inwardly to slide through the entrance of the protrusions 352 and into the corresponding slide channel 351. When the PCB 51 almost reaches a connector (not shown) located at a rear of the subrack 1, the alignment pin 54 extends into the alignment hole 353 and the alignment groove 354 to guide the PCB 51 to accurately engage with the connector. Once the PCB 51 engages with the connector, the pair of rear nails 58a of the handle 56 engage in the corresponding pair of rectangular openings 318. Thus the plug-in unit 50 is prevented from being accidentally withdrawn from the subrack 1. In this state, the contact portion 32b of the gasket 32 resiliently abuts against the alignment pin 54 to form a grounding path between the bottom wall 30 and the plug-in unit 50. Finally, the screw 55 is extended through the corresponding through aperture 356 of the first plate 35 and engaged in the corresponding screw aperture 314 of the second plate 31. The plug-in unit 50 is thus secured in the subrack 1.

To remove the plug-in unit 50 from the subrack 1, the screw 55 is disengaged from the screw aperture 314. The handle 56 is rotated downwardly so that it disengages from the rectangular openings 318. The plug-in unit 50 can then be easily slid out from the subrack 1.

In the present invention, all elements of the subrack 1 are made of sheet steel. Therefore, manufacturing costs of the subrack 1 are significantly reduced, and assembly of the subrack 1 is simplified.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A subrack for a plurality of plug-in units, each of the plug-in units comprising a printed circuit board and a mounting panel attached to an end of the printed circuit board, the mounting panel comprising an alignment pin and a screw extending therefrom, the subrack comprising:
   a pair of parallel sidewalls; and
   a bottom and a top wall fixed between the sidewalls to cooperatively define a receiving space therebetween adapted to accommodate the plug-in units therein; wherein each of the bottom and top walls comprises:
  a first plate comprising a main portion and a recessed edge portion, the main portion defining a plurality of spaced slide channels for slidably receiving the printed circuit boards therein respectively, and a plurality of alignment grooves adjacent the slide channels respectively for receiving the alignment pins to guide the plug-in units into said receiving space, the recessed edge portion defining a plurality of through apertures therein; and
  a second plate comprising a vertical portion defining a plurality of screw apertures therein corresponding to the through apertures, the screw apertures engagingly receiving the screws of the plug-in units respectively, at least one horizontal portion extending from a side of the vertical portion, the at least one horizontal portion being attached to the recessed edge portion thereby fixing the first and second plates together.

2. The subrack as described in claim 1, wherein the bottom and top walls are identical.

3. The subrack as described in claim 2, wherein the first and second plates are made of corrosion-protected sheet steel having a same thickness.

4. The subrack as described in claim 1, wherein a pair of spaced, divergent protrusions is arranged on the main portion of the first plate in front of each of the slide channels, the protrusions cooperatively forming an entrance in communication with the slide channel.

5. The subrack as described in claim 1, wherein the alignment grooves are formed by stamping the main portion of the first plate, and a front of the main portion defines a plurality of alignment holes in communication with the alignment grooves respectively.

6. The subrack as described in claim 1, wherein the recessed edge portion sequentially comprises first, second and third bent plates integrally joined together at respective perpendicularly bent junctions therebetween, and the through apertures are defined in the second bent plate.

7. The subrack as described in claim 6, wherein the second plate comprises first and second horizontal portions extending from opposite sides of the vertical portion in respective opposite directions, the first horizontal portion abutting the third bent plate, and the second horizontal portion abutting the first bent plate.

8. The subrack as described in claim 7, wherein at least one of the first and second horizontal portions is attached to its corresponding third and first bent plates via fastening devices.

9. The subrack as described in claim 7, wherein at least one of the first and second horizontal portions is soldered to its corresponding third and first bent plates.

10. The subrack as described in claim 7, wherein a plurality of extensions is formed at a free side of the second horizontal portion of the second plate corresponding to respective alignment grooves of the first plate, and a plurality of conductive gaskets is disposed between the extensions and the alignment grooves.

11. The subrack as described in claim 10, wherein each of the gaskets comprises a mounting portion, and a resilient contact portion extending obliquely from a side of the mounting portion, the mounting portion being attached to a corresponding extension.

12. The subrack as described in claim 11, wherein the mounting portion is attached to the corresponding extension with an adhesive.

13. The subrack as described in claim 11, wherein the mounting portion is flat, and the contact portion is arcuate.

14. An electrical assembly comprising:
two parallel sidewalls;
identical bottom and top walls fixed between the sidewalls;
each of said bottom and top walls comprising first and second plates fixed together;
  the first plate defining a plurality of spaced slide channels, and a plurality of alignment grooves adjacent the slide channels respectively, the first plate comprising a recessed edge portion defining a plurality of through apertures;
  the second plate comprising a vertical portion, and first and second horizontal portions extending from opposite sides of the vertical portion in respective opposite directions, the vertical portion defining a plurality of screw apertures aligned with the through apertures of the first plate, the first horizontal portion defining a plurality of pairs of rectangular openings, at least one of the first and second horizontal portions being attached to the recessed edge portion of the first plate; and
a plug-in unit received between said bottom and top walls, the plug-in unit comprising a printed circuit board slidably received in corresponding slide channels of said bottom and top walls, a mounting panel attached to an end of the printed circuit board and comprising a handle with a pair of claws engaged in a corresponding pair of rectangular openings, the mounting panel further comprising an alignment pin received in a corresponding alignment groove, and a screw extending through a corresponding through aperture and engaged in a corresponding screw aperture thereby securing the plug-in unit between said bottom and top walls.

15. The assembly as described in claim 14, wherein the second horizontal portion of the second plate comprises a plurality of extensions corresponding to the alignment grooves of the first plate respectively, and a conductive gasket is arranged between a corresponding extension and the corresponding alignment groove, the gasket abutting against the alignment pin to form a grounding path between the plug-in unit and the respective bottom or top wall.

16. An electrical assembly comprising:
opposite first and second walls spaced from each other in a vertical direction;
each of said first and second walls defining main and secondary sections, the main section defining at least one slide channel extending around the center portion along a front-to-back direction perpendicular to said vertical direction, and at least one inner step structure around a side portion along said front-to-back direction, an alignment groove formed in the inner step structure and extending along said front-to-back direction;
the secondary section defining an outer step structure essentially located on an outer side relative to the inner step structure, the inner step structure and the outer step structure commonly defining a two-step structure in said vertical direction,
a screw aperture formed in said secondary section and extending along said front-to-back direction;
a locking opening formed in the secondary section and extending along said vertical direction;
a plug-in unit including a printed circuit board and a mounting panel attached to a front end of the printed circuit board, a rotatable handle disposed on the panel, an alignment pin and a screw located on the panel under a condition that the alignment pin is located in an inner side and the screw is located an outer side of the panel along said vertical direction; wherein when assembled, the alignment pin is received in the alignment groove, the screw is secured in the secure aperture, and the handle is located in the locking opening.

17. The electrical assembly as described in claim 16, wherein said main section further defines an outer step structure essentially overlapped with and attached to the outer step of the secondary section.

18. The electrical assembly as described in claim 16, wherein said main section and said secondary section are discrete from each other.

19. The electrical assembly as described in claim 16, wherein a relatively resilient gasket located between said main section and said secondary section to supportably engage the alignment pin.

20. The electrical assembly as described in claim 19, wherein said gasket performs a grounding function.

* * * * *